United States Patent
Lin et al.

(10) Patent No.: US 11,011,391 B2
(45) Date of Patent: May 18, 2021

(54) SEMICONDUCTOR STRUCTURE AND METHOD FOR FABRICATING THE SAME

(71) Applicant: VANGUARD INTERNATIONAL SEMICONDUCTOR CORPORATION, Hsinchu (TW)

(72) Inventors: Yung-Fong Lin, Taoyuan (TW); Yu-Chieh Chou, New Taipei (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/502,644

(22) Filed: Jul. 3, 2019

(65) Prior Publication Data

US 2021/0005466 A1 Jan. 7, 2021

(51) Int. Cl.
*H01L 21/67* (2006.01)
*H01L 21/02* (2006.01)

(52) U.S. Cl.
CPC .... *H01L 21/67011* (2013.01); *H01L 21/0254* (2013.01); *H01L 21/02458* (2013.01); *H01L 21/02496* (2013.01); *H01L 21/02532* (2013.01)

(58) Field of Classification Search
CPC ......... H01L 21/67011; H01L 21/02458; H01L 21/0254; H01L 21/02532; H01L 21/26586; H01L 29/66803; H01L 21/02636–0265; H01L 21/2018; H01L 29/0843; H01L 29/66621; C23C 14/0641–0658; C23C 16/34–347; C23C 16/36; C01B 21/06–0768
See application file for complete search history.

(56) References Cited

U.S. PATENT DOCUMENTS

| | | | |
|---|---|---|---|
| 2015/0170901 A1* | 6/2015 | Motayed | H01L 21/02433 438/478 |
| 2018/0040764 A1* | 2/2018 | Henley | C30B 29/36 |

* cited by examiner

*Primary Examiner* — Omar F Mojaddedi
*Assistant Examiner* — Mohammad A Rahman
(74) *Attorney, Agent, or Firm* — Birch, Stewart, Kolasch & Birch, LLP

(57) ABSTRACT

A semiconductor structure and a method for fabricating the semiconductor structure are provided. The method includes providing a substrate; forming a silicon layer on the substrate, wherein an edge region of the top surface of the substrate is exposed from the silicon layer; epitaxially growing a GaN-based semiconductor material on the silicon layer and the substrate to form a GaN-based semiconductor layer on the silicon layer and a plurality of GaN-based nodules on the edge region of the top surface of the substrate; and performing a first dry etch step to remove the GaN-based nodules, wherein performing the first dry etch step includes applying a first bias power that is equal to or higher than 1500 W.

18 Claims, 6 Drawing Sheets

SEMICONDUCTOR STRUCTURE AND METHOD FOR FABRICATING THE SAME

BACKGROUND

Technical Field

The present disclosure relates to semiconductor fabricating technology, and more particularly to semiconductor structures having a GaN-based semiconductor material, high electron mobility transistors, and methods for fabricating the same.

Description of the Related Art

Gallium nitride-based (GaN-based) semiconductor materials have many excellent characteristics, such as high thermal resistance, wide band-gap, and high electron saturation rates. Therefore, GaN-based semiconductor materials are suitable for use in high-speed and high-temperature operating environments. In recent years, GaN-based semiconductor materials have been widely used in light-emitting diode (LED) elements and high-frequency elements, such as high electron mobility transistors (HEMTs) with heterogeneous interfacial structures.

With the development of GaN-based semiconductor materials, semiconductor structures that use GaN-based semiconductor materials are applied in more critical working environments, such as those with higher frequencies, higher temperatures, or higher voltages. Therefore, the process conditions of fabricating semiconductor devices with GaN-based semiconductor materials face various new challenges.

SUMMARY

Some embodiments of the present disclosure provide a method for fabricating a semiconductor structure. The method includes providing a substrate; forming a silicon layer on the substrate, wherein an edge region of a top surface of the substrate is exposed from the silicon layer; epitaxially growing a GaN-based semiconductor material on the silicon layer and the substrate to form a GaN-based semiconductor layer on the silicon layer and a plurality of GaN-based nodules on the edge region of the top surface of the substrate; and performing a first dry etch step to remove the GaN-based nodules, wherein performing the first dry etch step comprises applying a first bias power that is equal to or higher than 1500 W.

Some embodiments of the present disclosure provide a semiconductor structure. The semiconductor structure includes an aluminum nitride substrate, a silicon layer, and a GaN-based semiconductor layer. The silicon layer is formed on the aluminum nitride substrate. A top surface of an edge region of the aluminum nitride substrate is exposed from the silicon layer. The GaN-based semiconductor layer is formed on the silicon layer. An angle between a sidewall and a bottom surface of the GaN-based semiconductor layer is less than 90°.

The semiconductor structures of the present disclosure can be applied to various types of semiconductor devices. In order to make features and advantages of the present disclosure easy to understand, a detailed description with reference to the accompanying drawings is given in the following embodiments where the semiconductor structures are applied to HEMTs.

BRIEF DESCRIPTION OF THE DRAWINGS

In order to make features and advantages of the present disclosure easier to understand, a detailed description is given in the following various embodiments with reference to the accompanying drawings.

DETAILED DESCRIPTION

Figure 1A:
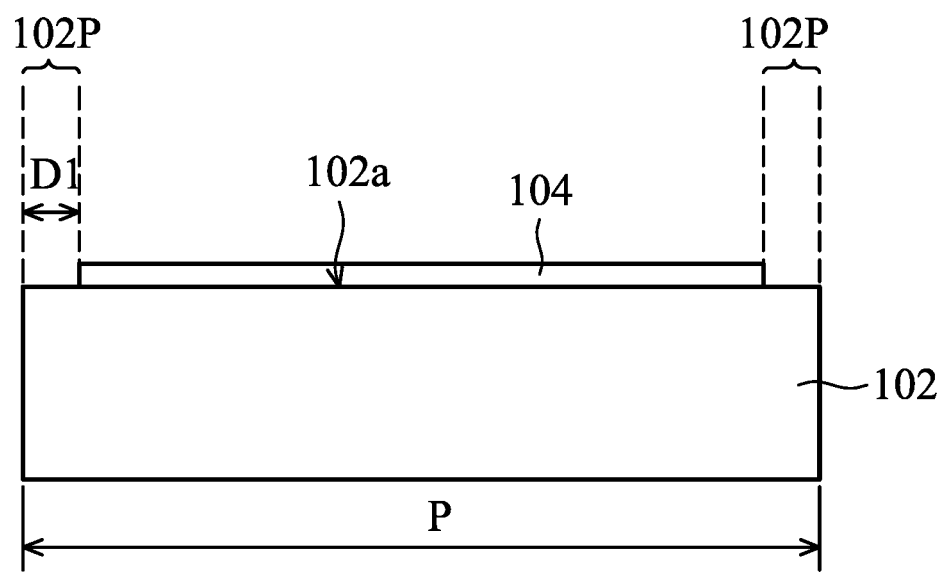
FIGS. 1A-1F illustrate cross-sectional views of forming a semiconductor structure at various intermediate stages in accordance with some embodiments of the present disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first component over or on a second component in the description that follows may include embodiments in which the first and second components are formed in direct contact, and may also include embodiments in which additional components may be formed between the first and second components, such that the first and second components may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of some embodiments are discussed below. Throughout the various views and illustrative embodiments, like reference numbers are used to designate like elements. It should be understood that additional operations can be provided before, during, and after the method, and some of the operations described can be replaced or eliminated for other embodiments of the method.

The terms "about", "approximately", and "substantially" used herein generally refer to the value of an error or a range within 20 percent, preferably within 10 percent, and more preferably within 5 percent, within 3 percent, within 2 percent, within 1 percent, or within 0.5 percent. If there is no specific description, the values mentioned are to be regarded as an approximation that is an error or range expressed as "about", "approximate", or "substantially".

The embodiments of the present disclosure provide semiconductor structures and methods for fabricating semiconductor structures. When a GaN-based semiconductor material is epitaxially grown on a silicon layer, GaN-based nodules are also formed and adhered to the substrate. These GaN-based nodules may easily fall off in subsequent processes, resulting in contaminations of the subsequent processes. This leads the GaN-based nodules a potential defect source in the manufacturing processes of semiconductor structures; however, the GaN-based nodules cannot be effectively removed by wet etching. According to the embodiments of the present disclosure, a first dry etch step applying a bias power of equal to or higher than 1500 W is performed, so that the GaN-based nodules can be effectively cleaned off, that the GaN-based nodules are a defect source in the manufacturing processes of semiconductor structures can be prevented, and thus the yields of the manufacturing processes of semiconductor structures can be further improved.

Figure 1B:
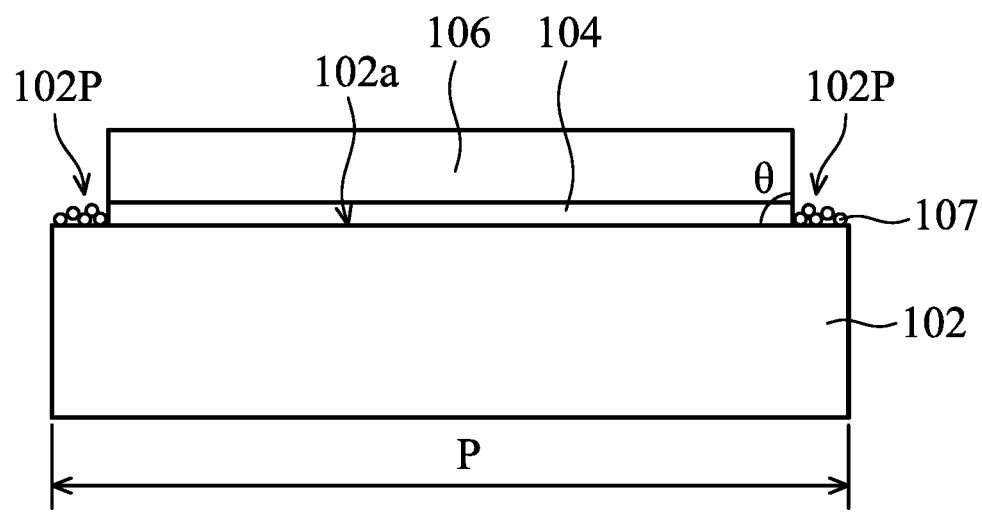
Figure 1C:
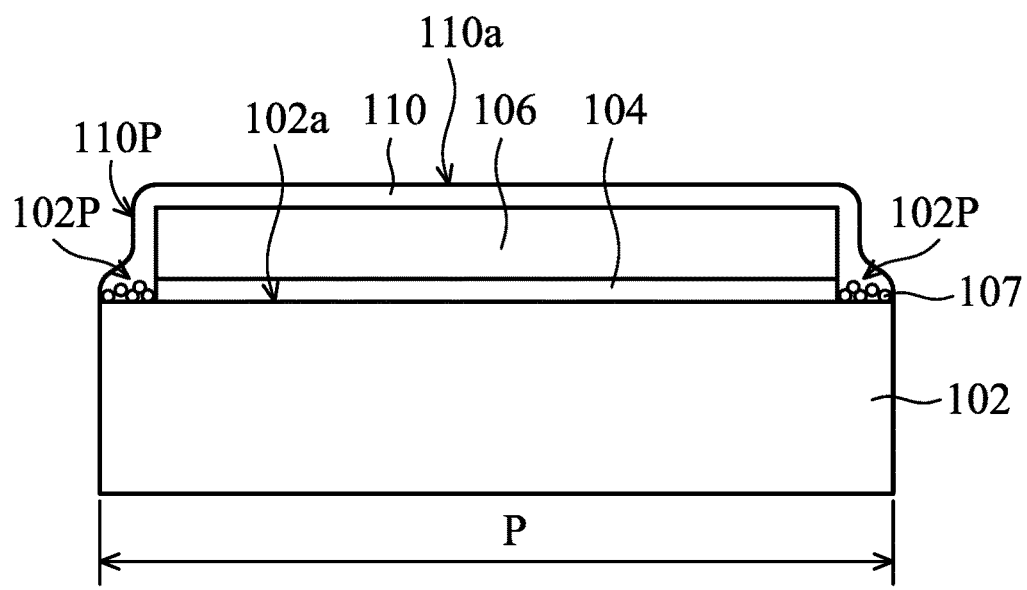
Figure 1D:
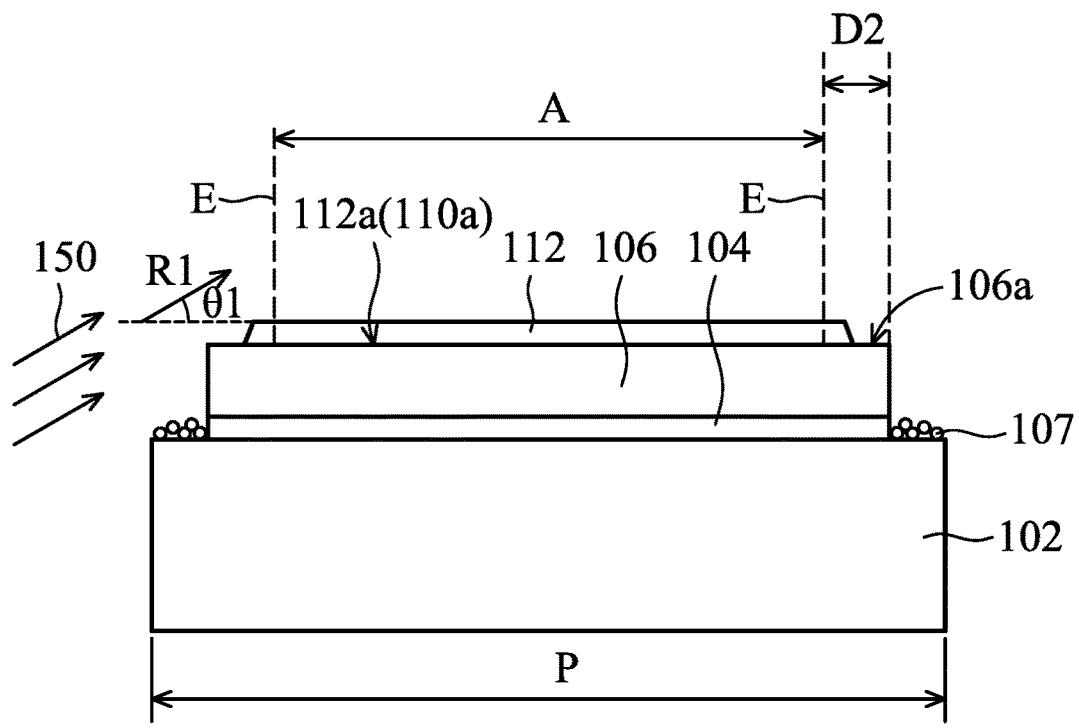
Figure 1E:
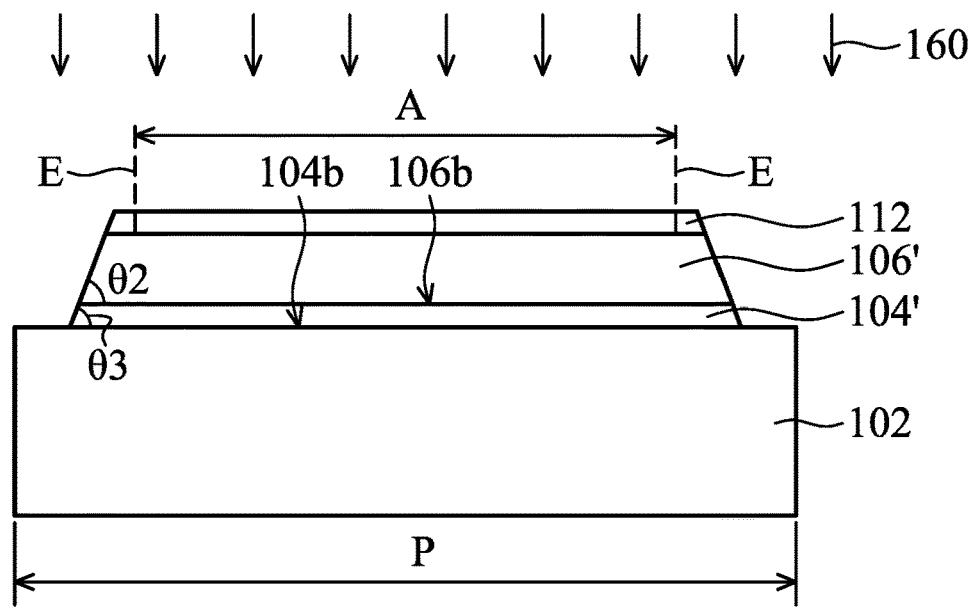
Figure 1F:
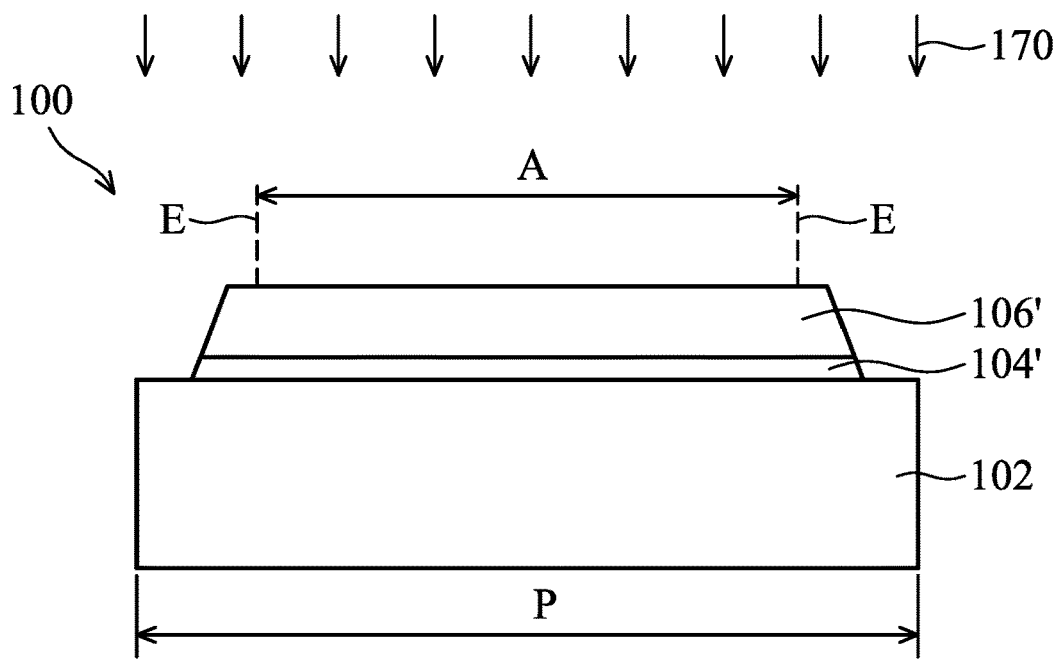

FIGS. 1A-1F illustrate cross-sectional views of forming a semiconductor structure 100 as shown in FIG. 1F at various intermediate stages in accordance with some embodiments of the present disclosure. Referring to FIG. 1A, a substrate 102 is provided. The substrate 102 may be circular, and the substrate 102 has a diameter P which may be 4 inches or more, such as 6 inches, 8 inches, or 12 inches, making it suitable for use in manufacturing equipment used in the semiconductor industry.

In some embodiments, the substrate 102 is a ceramic substrate formed by powder metallurgy in which ceramic powders are sintered at a high temperature. For example, the substrate 102 is an aluminum nitride (AlN) substrate, a silicon carbide (SiC) substrate, a sapphire substrate, other suitable similar substrates, or a combination thereof. In one embodiment, the substrate 102 is an AlN substrate. In some embodiments, the substrate 102 is used to fabricate a semiconductor device including a GaN-based semiconductor layer, such as a light-emitting diode (LED), a high frequency device, or a high voltage device. The high frequency device or the high voltage device may be, for example, a high electron mobility transistor (HEMT), a Schottky bipolar diode (SBD), a bipolar junction transistor (BJT), a junction field effect transistor (JFET), or an insulated gate bipolar transistor (IGBT).

As shown in FIG. 1A, a silicon layer 104 is formed on the substrate 102, and an edge region 102P of a top surface 102a of the substrate 102 is exposed from the silicon layer 104. In some embodiments, the edge region 102P surrounds the silicon layer 104 from the top view (not shown in drawings). In some embodiments, as shown in FIG. 1A, the edge of the silicon layer 104 and the edge of the substrate 102 are separated by a distance D1, and the distance D1 is the width of the edge region 102P. In some embodiments, the distance D1 may be in a range from about 1.5 mm to about 3 mm, such as about 2 mm. In some embodiments, the thickness of the silicon layer 104 may be in a range from about 300 nm to about 600 nm.

As shown in FIG. 1B, a GaN-based semiconductor material is epitaxially grown on the silicon layer 104 and the substrate 102 to form a GaN-based semiconductor layer 106 on the silicon layer 104 and a plurality of GaN-based nodules 107 on the edge region 102P of the top surface 102a of the substrate 102. In some embodiments, the GaN-based semiconductor material includes, for example, GaN, AlGaN, other suitable similar GaN-based semiconductor materials, or a combination thereof. In some embodiments, the thickness of the GaN-based semiconductor layer 106 is from about 5 μm to about 15 μm. In some embodiments, the size of the GaN-based nodules 107 is from about 1 μm to about 50 μm.

In some embodiments of the present disclosure, the GaN-based semiconductor layer 106 is epitaxially grown on a (111) lattice surface of the silicon layer 104. In other words, the GaN-based semiconductor layer 106 is, for example, a GaN-based epitaxial layer formed directly on a (111) lattice surface of the silicon layer 104. In some embodiments, the epitaxially grown GaN-based semiconductor layer 106 has substantially vertical sidewalls. For example, an angle θ between the extending line of a sidewall of the GaN-based semiconductor layer 106 and the top surface 102a of the substrate is from about 85° to about 95°, such as about 90°. In addition, the edge region 102P of the top surface 102a of the substrate 102 does not have a Si(111) lattice surface, which is disadvantageous to the epitaxial growth of a GaN-based semiconductor layer. Thus, the GaN-based nodules 107 having irregular shapes and sizes are formed, and the GaN-based nodules 107 are not adhered to the substrate 102 as stably as the GaN-based semiconductor layer 106 is.

Next, in some embodiments, as shown in FIGS. 1C-1D, a mask layer 112 is formed on the GaN-based semiconductor layer 106, so that a top surface 106a of the edge portion of the GaN-based semiconductor layer 106 and the edge region 102P of the top surface 102 of the substrate 102 are exposed from the mask layer 112. In some embodiments, the mask layer 112 may be a photoresist layer, a hard mask layer (such as a nitride layer), or a combination thereof. In some embodiments of the present disclosure, forming the mask layer 112 is prior to performing a first dry etch step 160, and the details of the first dry etch step 160 will be discussed hereinafter.

In some embodiments, as shown in FIG. 1C, a mask material layer 110 is formed on the GaN-based semiconductor layer 106 and the substrate 102. In some embodiments, the mask material layer 110 may include a photoresist material, a hard mask material (such as nitride), or a combination thereof. In some embodiments, the mask material layer 110 may be formed by using spin-on coating, chemical vapor deposition (CVD), suitable similar methods, or a combination thereof. As shown in FIG. 1C, the mask material layer 110 may cover the GaN-based semiconductor layer 106, the silicon layer 104, the GaN-based nodules 107, and the top surface 102a of the substrate 102. In some embodiments, as shown in FIG. 1C, an outer periphery 110P of the mask material layer 110 covers the sidewalls of the GaN-based semiconductor layer 106, the sidewalls of the silicon layer 104, the GaN-based nodules 107, and the edge region 102P of the top surface 102a of the substrate 102.

Next, as shown in FIG. 1D, an edge bevel removal (EBR) step 150 is performed on the outer periphery 110P of the mask material layer 110 to partially remove the mask material layer 110 to form the mask layer 112. In some embodiments, as shown in FIG. 1D, the mask layer 112 covers the device region A, and the device region A defines the active region of the substrate 102 that is for manufacturing semiconductor devices subsequently. In some embodiments, the edge E of the device region A is separated from the edge of the GaN-based semiconductor layer 106 by a distance D2, and the distance D2 is less than the distance D1 (i.e., the width of the edge region 102P). In some embodiments, the distance D2 is from about 0.3 mm to about 1 mm, such as about 0.5 mm. In some embodiments, the sum of the distance D1 and the distance D2 is equal to or larger than 2.5 mm, for example, from about 2.5 mm to about 3.5 mm.

In some embodiments, as shown in FIG. 1D, performing the EBR step 150 may include spraying a removing solution on the outer periphery 110P from a side of the mask material layer 110 to dissolve and thereby remove the outer periphery 110P, so that the top surface 106a of the edge portion of the GaN-based semiconductor layer 106 is exposed. In some embodiments, the removing solution may include an organic solvent, such as propylene glycol monomethyl ether (PGME), propylene glycol monomethyl ether ester (PGMEA), ethylene glycol monomethyl ether ester (EGMEA), ethyl lactate, cyclohexanone, or a combination thereof.

In some embodiments, the structure as shown in FIG. 1D may be displaced on a base of an EBR device (not shown), and a nozzle (not shown) of the EBR device is disposed on a side of the mask material layer 110 instead of above the mask material layer 110. Then, the base of the EBR device may drive the structure as shown in FIG. 1D to rotate with respect to the nozzle, so that the removing solution sprayed from the nozzle can be sprayed on and surround the whole outer periphery 110P completely. Thus, the outer periphery 110P is dissolved and thus removed, and the top surface 106a of the edge portion of the GaN-based semiconductor layer 106 is exposed.

In some embodiments, as shown in FIGS. 1C-1D, the spraying direction R1 of the removing solution is substantially parallel to the top surface 110a of the mask material layer 110 (i.e. the top surface 112a of the mask layer 112). In other words, the spraying direction R1 of the removing solution is substantially perpendicular to the sidewall of the GaN-based semiconductor layer 106 previously covered by the outer periphery 110P. For example, in some embodiments, an angle θ1 between the spraying direction R1 of the removing solution and the top surface 110a of the mask material layer 110 (i.e., the top surface 112a of the mask layer 112) is in a range from about 0° to about 30°. Thus, the removing solution is substantially sprayed only on the outer periphery 110P, and the removing solution is not sprayed on the top surface 110a of the mask material layer 110. As a result, the removing solution removes only the outer periphery 110P and only exposes the GaN-based nodules 107 that are supposed to be removed subsequently, and the removing solution does not reduce the thickness of the mask material layer 110 from above the mask material layer 110. Therefore, the as-formed mask layer 112 can be used to protect the underlying GaN-based semiconductor layer 106 in the device region A from being damaged by a dry etch step, for example, damaged by plasma in a dry etch step.

Next, referring to FIG. 1E, a first dry etch step 160 is performed to remove the GaN-based nodules 107. In the embodiments, performing the first dry etch step 160 includes applying a first bias power that is equal to or higher than 1500 W.

When a GaN-based semiconductor material is epitaxially grown on the silicon layer 104, the GaN-based semiconductor material may be also epitaxially grown on the substrate 102. The GaN-based nodules 107 adhered to the substrate 102 may easily fall off in subsequent processes, resulting in contaminations of the subsequent processes. This leads the GaN-based nodules 107 a potential defect source in the manufacturing processes of semiconductor structures. On the other hand, the GaN-based nodules 107 are provided with a certain level of adhesion strength with respect to the substrate 102, thus not only the GaN-based nodules 107 cannot be effectively removed by wet etching, but a dry etch process with insufficient energy also cannot effectively and completely remove the GaN-based nodules 107. According to the embodiments of the present disclosure, the first dry etch step 160 applying a bias power of equal to or higher than 1500 W is performed, so that the GaN-based nodules 107 can be effectively and completely removed, that the GaN-based nodules 107 are a defect source in the manufacturing processes of semiconductor structures can be prevented, and the yields of the manufacturing processes of semiconductor structures can be further improved.

In some embodiments, the first bias power is, for example, equal to or higher than 1800 W. In some embodiments, the first bias power is in a range, for example, from about 1800 W to about 2000 W.

According to the embodiments of the present disclosure, when the first bias power is equal to or higher than 1800 W, the bias power of the first dry etch step 160 is basically higher than the bias power applied in each of the subsequent dry etch processes. Therefore, using a bias power of equal to or higher than 1800 W for the first dry etch step 160 can ensure that even some of the GaN-based nodules 107 are not removed in the current stage, the unremoved nodules won't be able to be removed by any of the other subsequent dry etch processes with lower power utilizing bias lower that is lower than 1800 W. Therefore, that the GaN-based nodules 107 are a defect source in the manufacturing processes of semiconductor structures can be prevented, and the yields of the manufacturing processes of semiconductor structures can be further improved.

In some embodiments, the first dry etch step 160 may include using a fluorine-containing etchant, a chlorine-containing etchant, or a combination thereof. In some embodiments, the etchant may include $SF_6$, $CF_4$, $CHF_3$, $CH_2F_2$, $CH_3F$, $Cl_2$, or a combination thereof. In one embodiments, the etchant used in the first dry etch step 160 may include $SF_6$, $CF_4$, $Cl_2$, or a combination thereof.

According to the embodiments of the present disclosure, with the use of a fluorine-containing etchant and/or a chlorine-containing etchant, the GaN-based nodules 107 and by which the contaminations leftover on the surface can be removed by etching more effectively.

In some embodiments, the first dry etch step 160 is, for example, a dry plasma etching process that is performed for about 100 seconds to about 400 seconds. In one embodiment, the first dry etch step 160 is performed for about 200 seconds.

According to the embodiments of the present disclosure, the dry plasma etching process is performed for 100 seconds or longer and no more than 400 seconds, so that the time is long enough to build up sufficient energy to remove the GaN-based nodules 107, meanwhile the damage to the top surface 102a of the substrate 102 that may be due to plasma etching for too long can be prevented. Thus, the GaN-based nodules 107 can be effectively removed, and the structure of the top surface 102a of the substrate 102 can remain intact.

In some embodiments, the structure as shown in FIG. 1D may be placed on a platform in an etching chamber of an etching equipment (not shown in drawings), an etchant is evenly dispersed into the etching chamber through a shower head (not shown in drawings) of the etching equipment. Then, a bias power generator (not shown in drawings) of the etching equipment may apply a bias power to the etching chamber to generate a bias electric field between an upper electrode (not shown, generally disposed at the top of the etching chamber) and a lower electrode (not shown, generally disposed inside the platform of the etching chamber) of the etching equipment. The etchant is accelerated by the bias electric field in the etching chamber and proceed in the direction toward the platform to perform an anisotropic dry etch process on the structure as shown in FIG. 1D from above the mask layer 112. In some embodiments, referring to FIG. 1D, the anisotropic dry etch process is applied on, for example, the top surface 106a of the edge portion of the GaN-based semiconductor layer 106 and the edge region 102P of the top surface 102a of the substrate 102 that are exposed from the mask layer 112.

In some embodiments, as shown in FIG. 1E, the first dry etch step 160 removes the GaN-based nodules 107 on the edge portion 102P of the top surface 102a of the substrate 102. In some embodiments, as shown in FIG. 1E, the first dry etch step 160 also partially removes the GaN-based semiconductor layer 106 and the silicon layer 104 that are exposed from the mask layer 112, so that the region of the as-formed GaN-based semiconductor layer 106' unprotected by the mask layer 112 has inclined sidewalls, and the region of the as-formed silicon layer 104' unprotected by the mask layer 112 has inclined sidewalls.

In some embodiments, as shown in FIG. 1E, a sidewall of the GaN-based semiconductor layer 106' and a sidewall of the silicon layer 104' form a continuous inclined sidewall. An angle between the continuous inclined sidewall and the top surface 102a of the substrate 102 is, for example, less than 90°. In one embodiment, the angle between the continuous inclined sidewall and the top surface 102a of the substrate 102 is in a range, for example, from about 50° to about 85°.

In some embodiments, as shown in FIG. 1E, an angle θ2 between the sidewall and the bottom surface 106b of the GaN-based semiconductor layer 106' is, for example, less than 90°. In some embodiments, the angle θ2 between the sidewall and the bottom surface 106b of the GaN-based semiconductor layer 106' is in a range, for example, from about 50° to about 85°.

In some embodiments, as shown in FIG. 1E, an angle θ3 between the sidewall and the bottom surface 104b of the silicon layer 104' is, for example, less than 90°. In some embodiments, the angle θ3 between the sidewall and the bottom surface 104b of the silicon layer 104' is in a range, for example, from about 50° to about 85°. In some embodiments, the angle θ2 and the angle θ3 may be the same or different from each other.

Referring to FIG. 1F, after the first dry etch step 160 is performed, the mask layer 112 is removed. In some embodiments, an ashing process may be performed to remove the mask layer 112.

In some embodiments, after the mask layer 112 is removed, a cleaning step 170 may be further performed by using a cleaning solution to clean the GaN-based semiconductor layer 106' and the edge region 102P of the top surface 102a of the substrate 102. In some embodiments, the cleaning solution may include ammonia ($NH_4OH$), sulfuric acid ($H_2SO_4$), hydrogen peroxide ($H_2O_2$), water, or a combination thereof.

In some embodiments, a mixed solution of sulfuric acid and hydrogen peroxide with a volume ratio of about 2-4:1 may be used to wash off any possible remaining mask material from the mask layer 112 at a temperature of about 130° C. In addition, a mixed solution of ammonia, hydrogen peroxide and water with a volume ratio of about 0.05-1:1:1 may be used to wash off any possible remaining metal micro-particles from the GaN-based nodules 107 at a temperature of about 70° C.

According to the embodiments of the present disclosure, using the cleaning solution to clean the GaN-based semiconductor layer 106' and the edge region 102P of the top surface 102a of the substrate 102 can further completely wash off any possible remaining mask material and/or metal micro-particles. As such, the semiconductor structure 100 as shown in FIG. 1F is formed.

Next, according to the embodiments of the present disclosure, a semiconductor material layer may be formed over the GaN-based semiconductor layer 106', a dry etch process is performed to form at least a recess in the semiconductor material layer, and performing the dry etch process includes applying a bias power that is lower than the first bias power of the first dry etch step 160. In some embodiments, the semiconductor material layer formed over the GaN-based semiconductor layer 106' may include, for example, a GaN semiconductor layer, an $Al_xGa_{1-x}N$ layer (wherein 0<x<1), other suitable similar GaN-based semiconductor layers, or a combination thereof.

In the embodiments of the present disclosure, in addition to forming a semiconductor material layer over the GaN-based semiconductor layer 106' to form semiconductor structures of various embodiments, other devices and/or components including a GaN-based semiconductor material may also be formed on the semiconductor structure 100 as shown in FIG. 1F, so as to form semiconductor structures of various additional embodiments of the present disclosure. For example, the semiconductor device including a GaN-based semiconductor material may be a light-emitting diode (LED), a high electron mobility transistor (HEMT), a Schottky bipolar diode (SBD), a bipolar junction transistor (BJT), a junction field effect transistor (JFET), an insulated gate bipolar transistor (IGBT), or other similar devices. Embodiments of forming a semiconductor device over the substrate structure 100 as shown in FIG. 1F are described below, and a HEMT is used as an example.

FIGS. 2A-2E illustrate cross-sectional views of forming a HEMT by using the substrate structure in FIG. 1F at various intermediate stages in accordance with some embodiments of the present disclosure. The elements in the present embodiment sharing similar or the same labels with those in the previous embodiment are similar or the same elements, and the description of which is omitted.

In the embodiments as shown in FIGS. 2A-2E, only the device region A of the semiconductor structure of the embodiments of the present disclosure is shown to describe that other devices and/or components are formed on the semiconductor structure as shown in FIG. 1F to form semiconductor structures having HEMT's of various additional embodiments of the present disclosure. In the below embodiments as shown in FIGS. 2A-2E, the GaN semiconductor layer 204 is, for example, the above-mentioned GaN-based semiconductor layer 106, and the AlGaN semiconductor layer 206 is, for example, the above-mentioned semiconductor material layer, but the embodiments of the present disclosure are not limited thereto.

Figure 2A:
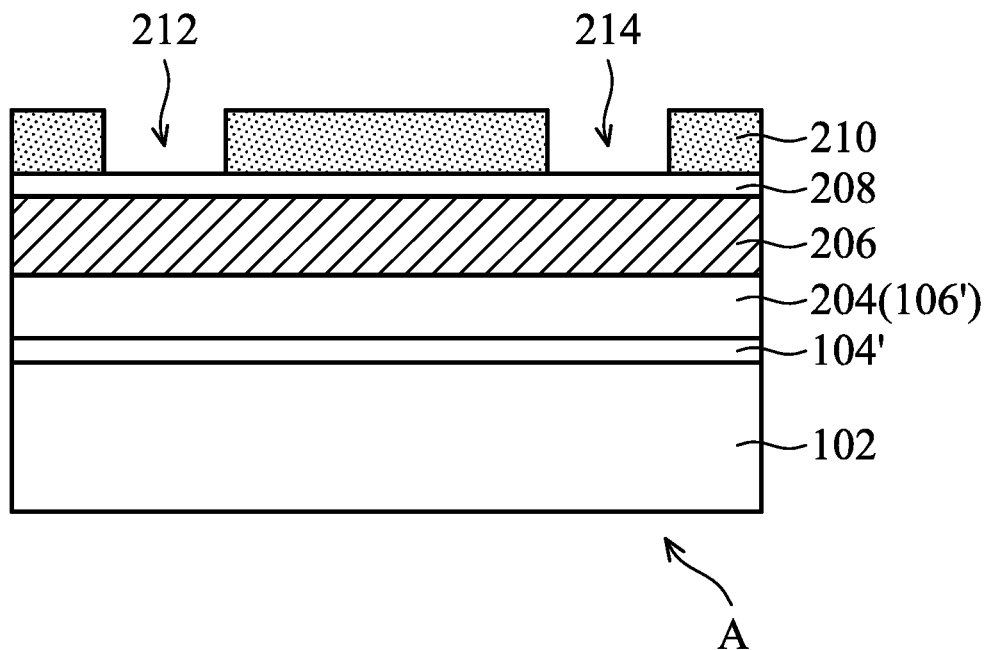
FIGS. 2A-2E illustrate cross-sectional views of forming a HEMT by using the substrate structure in FIG. 1F at various intermediate stages in accordance with some embodiments of the present disclosure.

Referring to FIG. 2A, an AlGaN semiconductor layer 206 (e.g., the above-mentioned semiconductor material layer) is formed on a GaN semiconductor layer 204 (e.g., the above-mentioned GaN-based semiconductor layer 106'). There is a heterogeneous interface between the GaN semiconductor layer 204 and the AlGaN semiconductor layer 206, so that a two-dimensional electron gas (2DEG, not shown) is formed at the heterogeneous interface. Therefore, the HEMT 200 shown in FIG. 2E may utilize 2DEG as conductive carriers. In some embodiments, the AlGaN semiconductor layer 206 may be formed by epitaxial growth processes, such as MOCVD, HVPE, MBE, suitable similar methods, or a combination thereof. In some embodiments, the GaN semiconductor layer 204 and the AlGaN semiconductor layer 206 may have dopants, such as n-type dopants or p-type dopants.

Next, a silicon-containing insulating layer 208 is formed on the GaN semiconductor layer 204 (e.g., the above-mentioned GaN-based semiconductor layer 106'). In some embodiments, the silicon-containing insulating layer 208 may be a high-quality film formed by using ALD, thermal oxidation, or similar deposition processes. The material of the silicon-containing insulating layer 208 may be silicon oxide, silicon nitride, silicon oxynitride, suitable similar materials, or a combination thereof. The formation of the silicon-containing insulating layer 208 that is a high-quality film on the AlGaN semiconductor layer 206 can prevent current leakage of a source contact (a first contact 220), a drain contact (a second contact 222), and a gate contact (a third contact 228) (shown in FIG. 2E) that are subsequently formed.

As shown in FIG. 2A, a material layer of a mask layer 210 is formed on the silicon-containing insulating layer 208. A first opening 212 and a second opening 214 are then formed in the material layer of the mask layer 210 by photolithographic technology. The first opening 212 and the second opening 214 expose a portion of the top surface of the silicon-containing insulating layer 208.

Figure 2B:
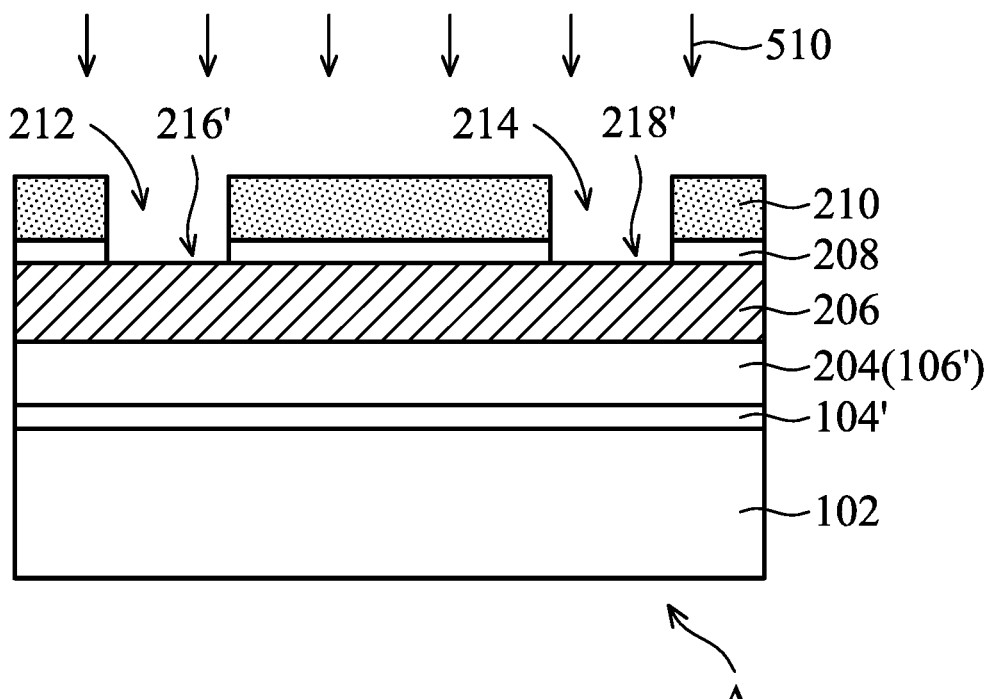

Next, referring to FIG. 2B, a second dry etch step 510 is performed through the first opening 212 and the second opening 214 of the mask layer 210 to form a first recess 216' and a second recess 218' in the silicon-containing insulating layer 208. In some embodiments, performing the second dry etch step 510 includes applying a second bias power, and the second bias power is lower than the first bias power. According to the embodiments of the present disclosure, because the second bias power is lower than the first bias power, even some of the GaN-based nodules 107 are not removed by the first dry etch step 160, the second dry etch step 510 still cannot make the unremoved GaN-based nodules 107 fall off, and thus the yield of the manufacturing process can be prevented from being adversely affected. In some embodiments, the second bias power is in a range, for example, from 100 W to about 500 W.

Figure 2C:
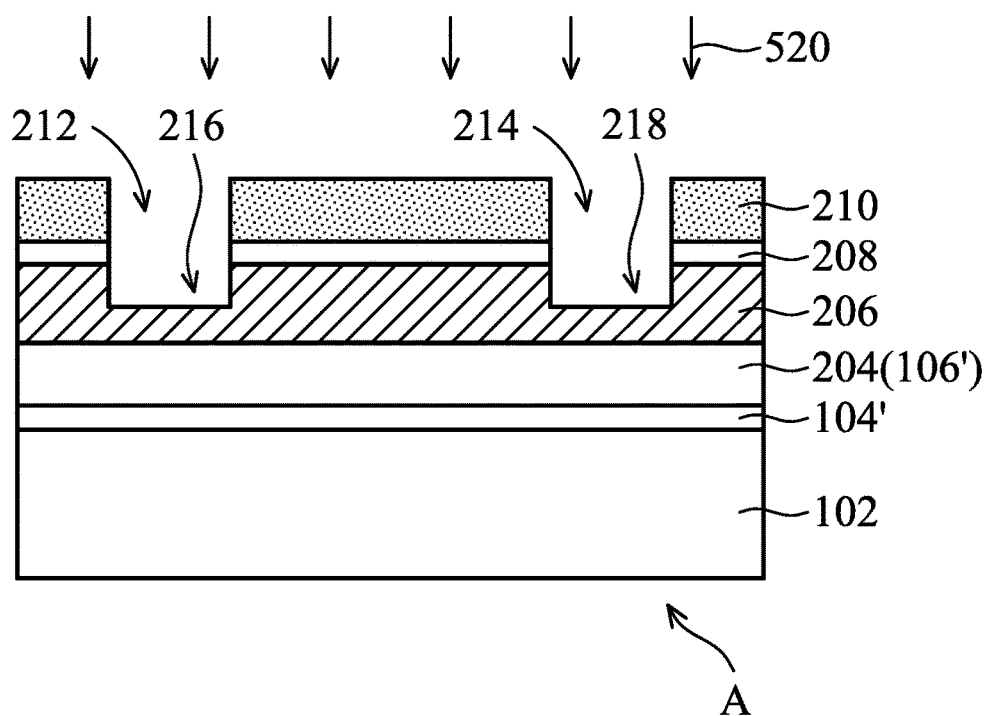

Next, referring to FIG. 2C, a third dry etch step 520 is performed to etch the GaN-based semiconductor layer 204 (e.g., the above-mentioned GaN-based semiconductor layer 106') so as to enlarge the first recess 216' and the second recess 218' to extend into the GaN-based semiconductor layer 206, so that the first recess 216 and the second recess 218 are formed. In some embodiments, performing the third dry etch step 520 includes applying a third bias power, and the third bias power is lower than the first bias power. According to the embodiments of the present disclosure, because the third bias power is lower than the first bias power, even some of the GaN-based nodules 107 are not removed by the first dry etch step 160, the third dry etch step 520 still cannot make the unremoved GaN-based nodules 107 fall off, and thus the yield of the manufacturing process can be prevented from being adversely affected. In some embodiments, the third bias power is in a range, for example, from 1000 W to about 1350 W.

Figure 2D:
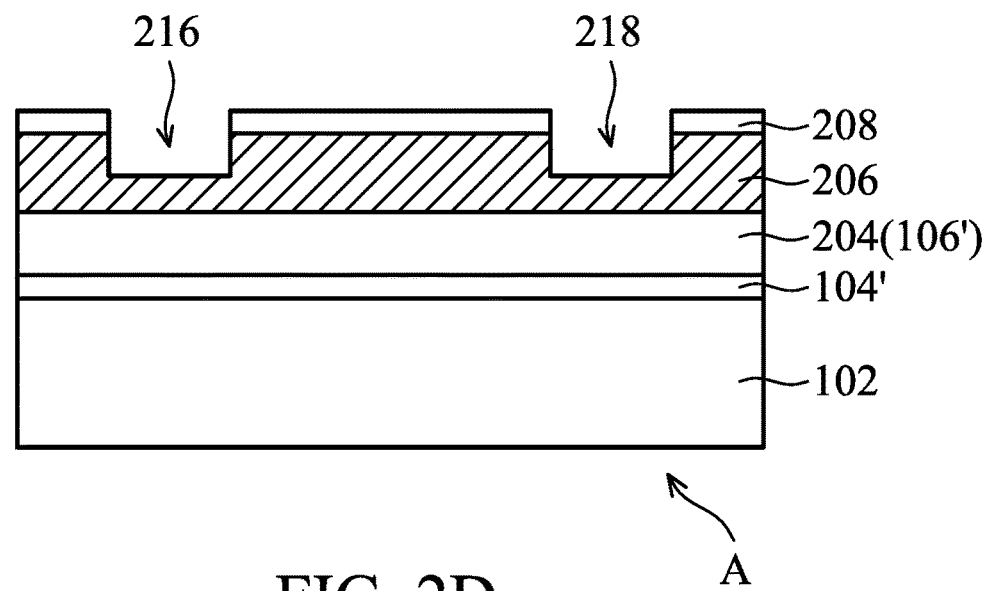

Next, referring to FIG. 2D, after the third dry etch step 520, an ashing process may be performed to remove the mask layer 210 on the silicon-containing insulating layer 208.

Next, referring to FIG. 2D, a first contact 220 and a second contact 222 are formed in the first recess 216 and the second recess 218, respectively. In some embodiments, the first contact 220 is, for example, a source contact, and the second contact 220 is, for example, a drain contact. The first contact 220 and the second contact 222 are located on and in electrical contact with the AlGaN semiconductor layer 206. In some embodiments, the first recess 216 and the second recess 218 may be incompletely filled with the first contact 220 and the second contact 222. The first contact 220 and the second contact 222 are formed along the sidewalls and the bottom surfaces of the first recess 216 and the second recess 218 and extend onto a portion of the surface of the silicon-containing insulating layer 208. In some embodiments, the materials of the first contact 220 and the second contact 222 may be conductive materials, such as Au, Ni, Pt, Pd, Ir, Ti, Cr, W, Al, Cu, TaN, TiN, $WSi_2$, suitable similar materials, or a combination thereof. The first contact 220 and the second contact 222 may be formed by ALD, CVD, PVD, sputtering, suitable similar processes, or a combination thereof. In some embodiments, the first contact 220 and the second contact 222 may be formed together in the same deposition process.

Figure 2E:
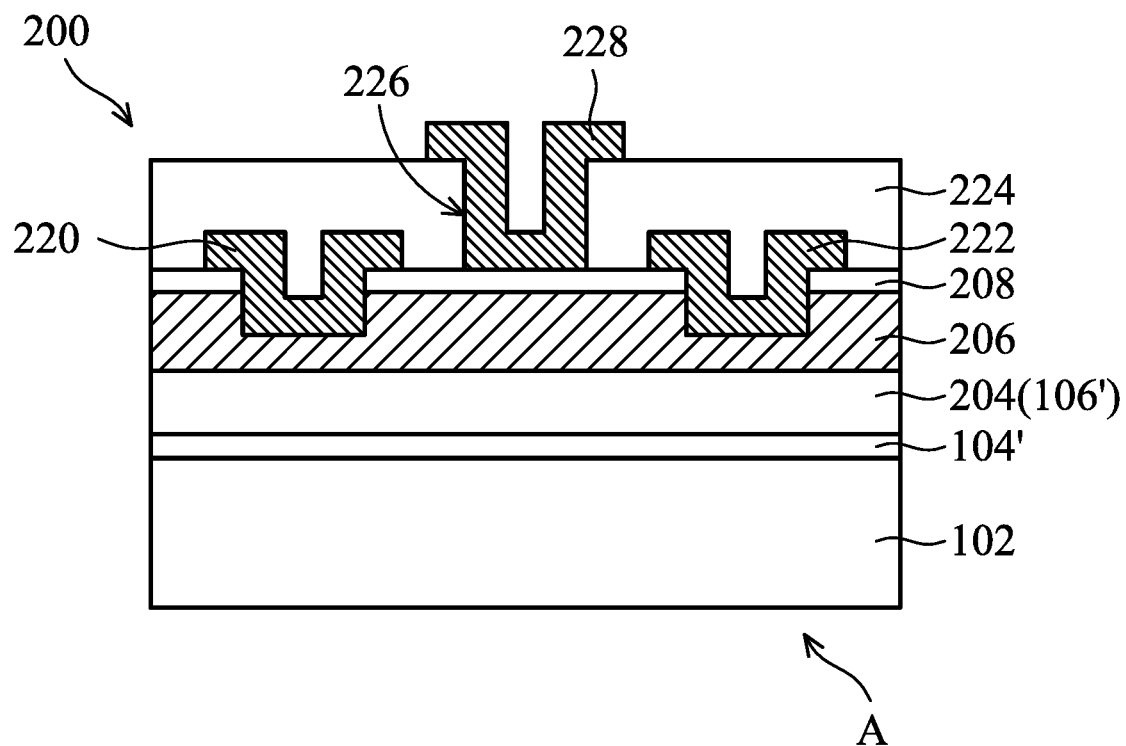

Next, in some embodiments, as shown in FIG. 2E, a passivation layer 224 is formed on the first contact 220 and the second contact 222. The passivation layer 224 covers the first contact 220 and the second contact 222. In some embodiments, the material of the passivation layer 224 may be silicon oxide, silicon nitride, silicon oxynitride, suitable similar materials, or a combination thereof. In some embodiments, the passivation layer 224 may be formed by CVD, PECVD, ALD, or suitable similar methods.

Next, in some embodiments, as shown in FIG. 2E, a third recess 226 is formed in the passivation layer 224 by photolithography technology and an etching process. The third recess 226 is located between the first contact 220 and the second contact 222. Next, a third contact 228 is formed in the third recess 226 between the first contact 220 and the second contact 222. In some embodiments, the third contact 228 is, for example, a gate contact. As such, the HEMT 200 is formed. In some embodiments, the third contact 228 is located on the silicon-containing insulating layer 208 and between the first contact 220 and the second contact 222. In some embodiments, the third recess 226 may be incompletely filled with the third contact 228, and the third contact 228 is formed along the sidewalls and the bottom surface of the third recess 226 and extended onto a portion of the surface of the passivation layer 224. In some embodiments, the material of the third contact 228 may be a conductive material, such as Au, Ni, Pt, Pd, Ir, Ti, Cr, W, Al, Cu, TaN, TiN, $WSi_2$, suitable similar materials, or a combination thereof. The third contact 228 may be formed by ALD, CVD, PVD, sputtering, or suitable similar processes. The first contact 220 and the second contact 222 may be in electrical contact with external circuitry by a metal layer (not shown) that passes through the passivation layer 224.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method for fabricating a semiconductor structure, comprising:
  providing a substrate;
  forming a silicon layer directly on the substrate, wherein an edge region of a top surface of the substrate is exposed from the silicon layer;
  epitaxially growing a GaN-based semiconductor material on the silicon layer and the substrate to form a GaN-based semiconductor layer directly on the silicon layer and a plurality of GaN-based nodules on the edge region of the top surface of the substrate; and
  performing a first dry etch step to remove the GaN-based nodules and partially removes the GaN-semiconductor layer and the silicon layer so that a sidewall of the GaN-based semiconductor layer and a sidewall of the silicon layer form a continuous inclined sidewall, and an angle between the continuous inclined sidewall and the top surface of the aluminum nitride substrate is in a range from 50° to 85°, wherein performing the first dry etch step comprises applying a first bias power that is equal to or higher than 1500 W.

2. The method for fabricating the semiconductor structure as claimed in claim 1, wherein the first bias power is in a range from 1800 W to 2000 W.

3. The method for fabricating the semiconductor structure as claimed in claim 1, wherein performing the first dry etch step comprises using a fluorine-containing etchant, a chlorine-containing etchant, or a combination thereof.

4. The method for fabricating the semiconductor structure as claimed in claim 1, wherein the first dry etch step is a dry plasma etching process that is performed for 100 seconds to 400 seconds.

5. The method for fabricating the semiconductor structure as claimed in claim 1, further comprising:
   forming a mask layer on the GaN-based semiconductor layer before performing the first dry etch step, wherein a top surface of an edge portion of the GaN-based semiconductor layer and the edge region of the top surface of the substrate are exposed from the mask layer.

6. The method for fabricating the semiconductor structure as claimed in claim 5, wherein forming the mask layer comprises:
   forming a mask material layer on the GaN-based semiconductor layer and the substrate; and
   performing an edge bevel removal (EBR) step on an outer periphery of the mask material layer to partially remove the mask material layer so as to form the mask layer.

7. The method for fabricating the semiconductor structure as claimed in claim 6, wherein performing the EBR step comprises:
   spraying a removing solution on the outer periphery from a side of the mask material layer.

8. The method for fabricating the semiconductor structure as claimed in claim 5, wherein the first dry etch step is an anisotropic dry etch process that is performed from above the mask layer, and the anisotropic dry etch process is performed on the top surface of the edge portion of the GaN-based semiconductor layer and the edge region of the top surface of the substrate which are exposed from the mask layer.

9. The method for fabricating the semiconductor structure as claimed in claim 5, further comprising:
   removing the mask layer after performing the first dry etch step; and
   cleaning the GaN-based semiconductor layer and the edge region of the top surface of the substrate with a cleaning solution, wherein the cleaning solution comprises ammonia, sulfuric acid, hydrogen peroxide, water, or a combination thereof.

10. The method for fabricating the semiconductor structure as claimed in claim 1, further comprising:
    forming a semiconductor material layer over the GaN-based semiconductor layer; and
    performing a dry etch process to form at least a recess in the semiconductor material layer, wherein performing the dry etch process comprises applying a bias power that is lower than the first bias power of the first dry etch step.

11. The method for fabricating the semiconductor structure as claimed in claim 1, further comprising:
    forming a silicon-containing insulating layer on the GaN-based semiconductor layer; and
    performing a second dry etch step to form a first recess and a second recess in the silicon-containing insulating layer, wherein performing the second dry etch step comprises applying a second bias power, and the second bias power is lower than the first bias power.

12. The method for fabricating the semiconductor structure as claimed in claim 11, further comprising:
    performing a third dry etch step to etch the GaN-based semiconductor layer so as to enlarge the first recess and the second recess to extend into the GaN-based semiconductor layer, wherein performing the third dry etch step comprises applying a third bias power, and the third bias power is lower than the first bias power.

13. The method for fabricating the semiconductor structure as claimed in claim 12, further comprising:
    forming a first contact and second contact in the first recess and the second recess respectively; and
    forming a third contact between the first contact and the second contact.

14. A semiconductor structure; comprising:
    an aluminum nitride substrate;
    a silicon layer directly formed on the aluminum nitride substrate, wherein a top surface of an edge region of the aluminum nitride substrate is exposed from the silicon layer; and
    a GaN-based semiconductor layer directly formed on the silicon layer, wherein an angle between a sidewall and a bottom surface of the GaN-based semiconductor layer is less than 90°,
    wherein the sidewall of the GaN-based semiconductor layer and a sidewall of the silicon layer form a continuous inclined sidewall, and an angle between the continuous inclined sidewall and the top surface of the aluminum nitride substrate is in a range from 50° to 85°.

15. The semiconductor structure as claimed in claim 14, wherein the angle between the sidewall and the bottom surface of the GaN-based semiconductor layer is in a range from 50° to 85°.

16. The semiconductor structure as claimed in claim 14, wherein an angle between a sidewall and a bottom surface of the silicon layer is less than 90°.

17. The semiconductor structure as claimed in claim 14, wherein the GaN-based semiconductor layer is a GaN-based epitaxial layer directly formed on a (111) lattice surface of the silicon layer.

18. The semiconductor structure as claimed in claim 14, wherein the edge region surrounds the silicon layer.

* * * * *